United States Patent
Woo et al.

(10) Patent No.: US 11,612,058 B2
(45) Date of Patent: Mar. 21, 2023

(54) MODULE ASSEMBLY MOUNTED ON HEADLINING OF VEHICLE

(71) Applicant: HYUNDAI MOBIS Co., Ltd., Seoul (KR)

(72) Inventors: Myeong Nam Woo, Yongin-si (KR); Uhn Yong Shin, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 81 days.

(21) Appl. No.: 17/201,531

(22) Filed: Mar. 15, 2021

(65) Prior Publication Data

US 2021/0289627 A1 Sep. 16, 2021

(30) Foreign Application Priority Data

Mar. 16, 2020 (KR) ........................ 10-2020-0032143

(51) Int. Cl.
*H05K 1/14* (2006.01)
*B60R 13/02* (2006.01)

(52) U.S. Cl.
CPC ......... *H05K 1/144* (2013.01); *B60R 13/0212* (2013.01); *B60R 2013/0287* (2013.01); *H05K 2201/042* (2013.01); *H05K 2201/10098* (2013.01); *H05K 2201/10151* (2013.01)

(58) Field of Classification Search
CPC ............. H05K 1/144; H05K 2201/042; H05K 2201/10098; H05K 2201/10151; B60R 13/0212; B60R 13/0287
USPC .......................................................... 361/742
See application file for complete search history.

(56) References Cited

U.S. PATENT DOCUMENTS

| | | | |
|---|---|---|---|
| 2009/0175015 A1* | 7/2009 | Mukouyama | H05K 1/148 361/792 |
| 2018/0242469 A1* | 8/2018 | Suzuki | G06F 1/182 |
| 2020/0235025 A1* | 7/2020 | Shimizu | H01L 23/367 |

FOREIGN PATENT DOCUMENTS

KR 10-2040550 B1 11/2019

\* cited by examiner

*Primary Examiner* — Andargie M Aychillhum
(74) *Attorney, Agent, or Firm* — Morgan, Lewis & Bockius LLP

(57) ABSTRACT

A module assembly is attached on a headlining of a vehicle and includes a base where an upper portion thereof is open, a first printed circuit board (PCB) and a second PCB sequentially stacked on a plurality of supporting pillars extending in a vertical direction to an inner bottom surface of the base and electrically connected to each other by a flexible cable, and a cover assembled with the base to cover the first and second PCBs stacked on the base.

15 Claims, 8 Drawing Sheets

SLIDING ASSEMBLY DIRECTION
(Y-AXIS DIRECTION) OF FIRST PCB 120

MODULE ASSEMBLY MOUNTED ON HEADLINING OF VEHICLE

CROSS-REFERENCE TO RELATED APPLICATIONS

This application claims priority under 35 U.S.C. § 119 to Korean Patent Application No. 10-2020-0032143, filed on Mar. 16, 2020, the disclosure of which is incorporated herein by reference in its entirety.

TECHNICAL FIELD

The present invention relates to a module assembly mounted on a headlining of a vehicle (a vehicle roof).

BACKGROUND

A digital key module 10 of version 1.0 of the related art is mounted on a vehicle chassis (or a specific structure 30 (for example, HVAC) of a vehicle) by using a bracket 20, a bolt, and a nut configuring an iron structure as illustrated in FIG. 1.

Recently, a digital key module updated to version 2.0 (hereinafter referred to as a digital key 2.0 module) may be mounted on a headlining of a vehicle (a vehicle roof) so as to appropriately perform a fundamental performance of a digital key.

In a case where the digital key 2.0 module is mounted on a vehicle roof by using the bracket 20, the bolt, and the nut configuring the iron structure, it may be difficult to configure a package of the digital key 2.0 module, and moreover, secondary injury may occur due to the bolt, the nut, and the bracket 20 detached from the iron structure when a vehicle is overturned.

A rear occupant alert (ROA) system for monitoring a rear occupant is installed in a headlining of a vehicle (a vehicle roof).

Because a space between a headlining and a rood of a vehicle is very narrow and small, it is difficult to determine a mounting place (or an installation place) at which the digital key 2.0 module is mounted on a headlining, in a state where the ROA system is installed in the headlining.

Furthermore, in a case where a rear room lamp and the ROA system are mounted on a headlining of a panorama sunroof vehicle, it is very difficult to determine a mounting place (or an installation place) at which the digital key 2.0 module is mounted on a headlining.

SUMMARY

Accordingly, the present invention provides an assembly in which a digital key module is integrated into an ROA module installed in a headlining, for installing a digital key 2.0 module in a headlining of a vehicle.

The present invention also provides an assembly in which a digital key module is easily inserted into and detached from an ROA module on the basis of a vehicle option. Accordingly, the present invention is for ① enhancing workability, ② overcoming a limited package, and ③ securing competitiveness through integration contract.

In one general aspect, a module assembly, attached on a headlining of a vehicle, includes: a base where an upper portion thereof is open; a first printed circuit board (PCB) and a second PCB sequentially stacked on a plurality of supporting pillars extending in a vertical direction to an inner bottom surface of the base and electrically connected to each other by a flexible cable; and a cover assembled with the base to cover the first and second PCBs stacked on the base.

In another general aspect, a module assembly, attached on a headlining of a vehicle, includes: a base where an upper portion thereof is open; a first printed circuit board (PCB) and a second PCB sequentially stacked on a plurality of supporting pillars extending in a vertical direction to an inner bottom surface of the base and connected to each other in a docking structure between a male connector and a female connector; and a cover assembled with the base to cover the first and second PCBs stacked on the base.

In another general aspect, a module assembly, attached on a headlining of a vehicle, includes: a base where an upper portion thereof is open; a first printed circuit board (PCB) and a second PCB sequentially stacked on a plurality of supporting pillars extending in a vertical direction to an inner bottom surface of the base and electrically connected to each other by a spring terminal; and a cover assembled with the base to cover the first and second PCBs stacked on the base.

Other features and aspects will be apparent from the following detailed description, the drawings, and the claims.

DETAILED DESCRIPTION OF EMBODIMENTS

Figure 1:
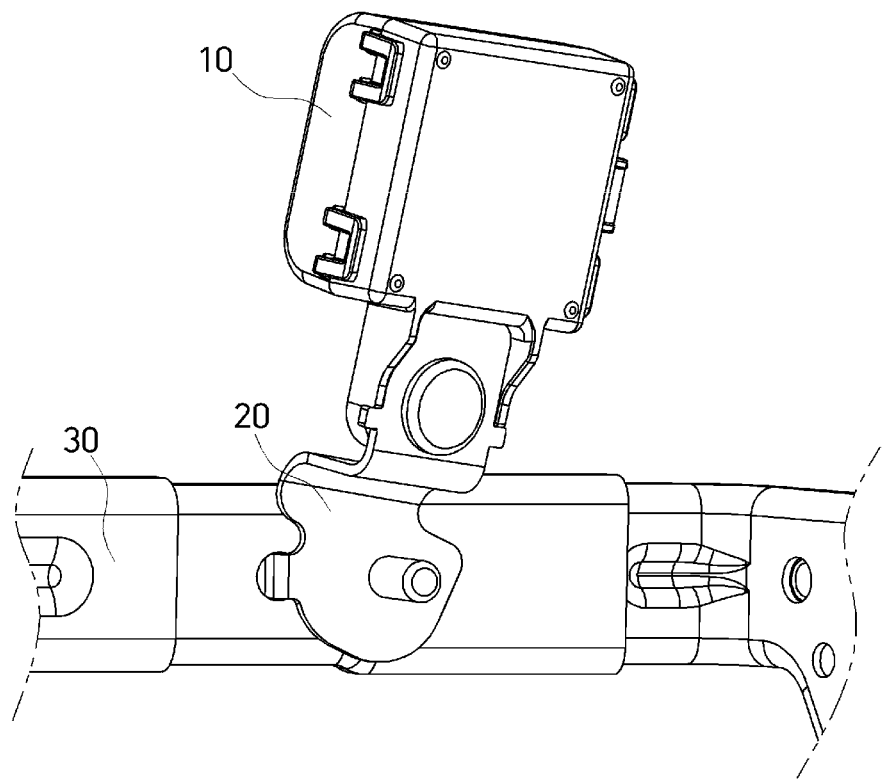
FIG. 1 is a diagram for describing a mount structure of a digital key module of the related art.

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to one of ordinary skill in the art. In the drawings, the dimensions of layers and regions are exaggerated or reduced for clarity of illustration. For example, a dimension and thickness of each element in the drawings are arbitrarily illustrated for clarity, and thus, embodiments of the present invention are not limited thereto. Also, in the drawings, a shape or a size of each element is exaggerated for convenience of a description and clarity, and elements irrelevant to a description are omitted. In addition, all conditional terms listed herein and understood that the embodiments are intended only for the purpose of, in principle, to understand the concept of the present invention is clearly not limited to the embodiment and state specifically enumerated.

The terms used herein are for the purpose of describing particular embodiments only and are not intended to be limiting of example embodiments.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Hereinafter, embodiments of the present invention will be described in detail with reference to the accompanying drawings.

Figure 2:
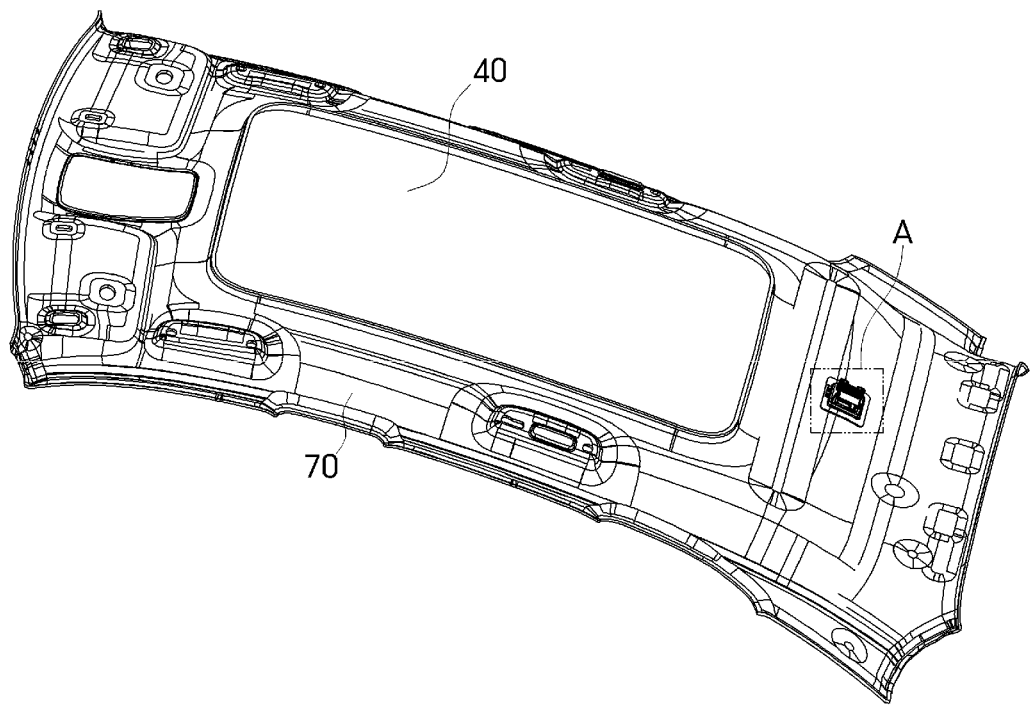
FIG. 2 is a diagram for describing an installation place of a module assembly into which a digital key 2.0 module (hereinafter referred to as a digital key module) and a rear occupant alert (ROA) module are integrated, according to an embodiment of the present invention.
Figure 3:
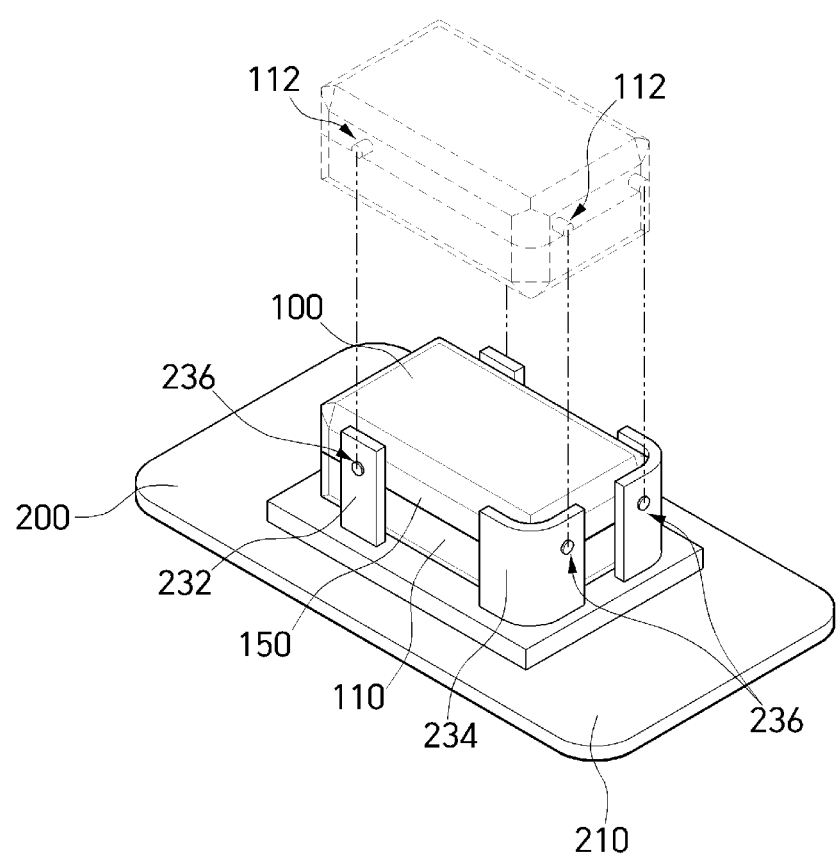
FIG. 3 is an enlarged view of a region A illustrated in FIG. 2 and is a diagram illustrating a whole appearance shape of a module assembly.

FIG. 2 is a diagram for describing an installation place of a module assembly 100 into which a digital key 2.0 module (hereinafter referred to as a digital key module) and a rear occupant alert (ROA) module are integrated, according to an embodiment of the present invention, and FIG. 3 is an enlarged view of a region A illustrated in FIG. 2 and is a diagram illustrating a whole appearance shape of a module assembly.

Referring to FIG. 2, the module assembly 100 into which a digital key 2.0 module (hereinafter referred to as a digital key module) and a rear occupant alert (ROA) module are integrated, according to an embodiment of the present invention, may be mounted on a headlining 70. In FIG. 2, an empty region at a center of the headlining 70 may represent a sunroof region 40.

In order to mount the module assembly 100 according to an embodiment of the present invention on the headlining 70, the module assembly 100 may be attached on the headlining 70 by using a mounting plate 200.

That is, as illustrated in FIG. 3, the module assembly 100 may be mounted on the mounting plate 200, and then, the mounting plate 200 may be attached on the headlining 70.

The mounting plate 200 may include a plastic material, and a hot-melt method (a hot-melt adhesive) may be used as a method of attaching the mounting plate 200 on the headlining 70 including a nonwoven material.

The mounting plate 200 with the module assembly 100 mounted thereon may include a plate member 210 attached on a surface of the headlining 70 and four supporting members with the module assembly 100 mounted thereon.

The plate member 210 may be implemented in a tetragonal shape, and for example, a bottom surface thereof may be attached on the surface of the headlining 70 on the basis of the hot-melt method (the hot-melt adhesive).

The four supporting members 232 and 234 may extend in a vertical direction from a top surface of the plate member 210.

Two supporting members 232 of the four supporting members 232 and 234 may support both side surfaces of the module assembly 100, and the two other supporting members 234 may support both corners of the module assembly 100.

The two supporting members 234 may be molded to have a cross-sectional shape which is vertically bent to support both corners of the module assembly 100.

A fixing groove 236 may be molded in each supporting member 232 or 234, and four fixing protrusion portions 112 molded in side surfaces of the module assembly 100 inserted into may be inserted into an upper portion may be inserted into four fixing grooves 236.

As described below, the module assembly 100 may include a base 110 and a cover 150 which covers an upper portion of the base 110, and the fixing protrusion portion 112 inserted into each fixing groove 236 may be provided (molded) at a side surface of the cover 150.

As described above, the fixing protrusion portion 112 may be inserted into the fixing groove 236, and thus, the module assembly 100 may be fixed not to move upward, downward, leftward, and rightward on the mounting plate 200.

Figure 4:
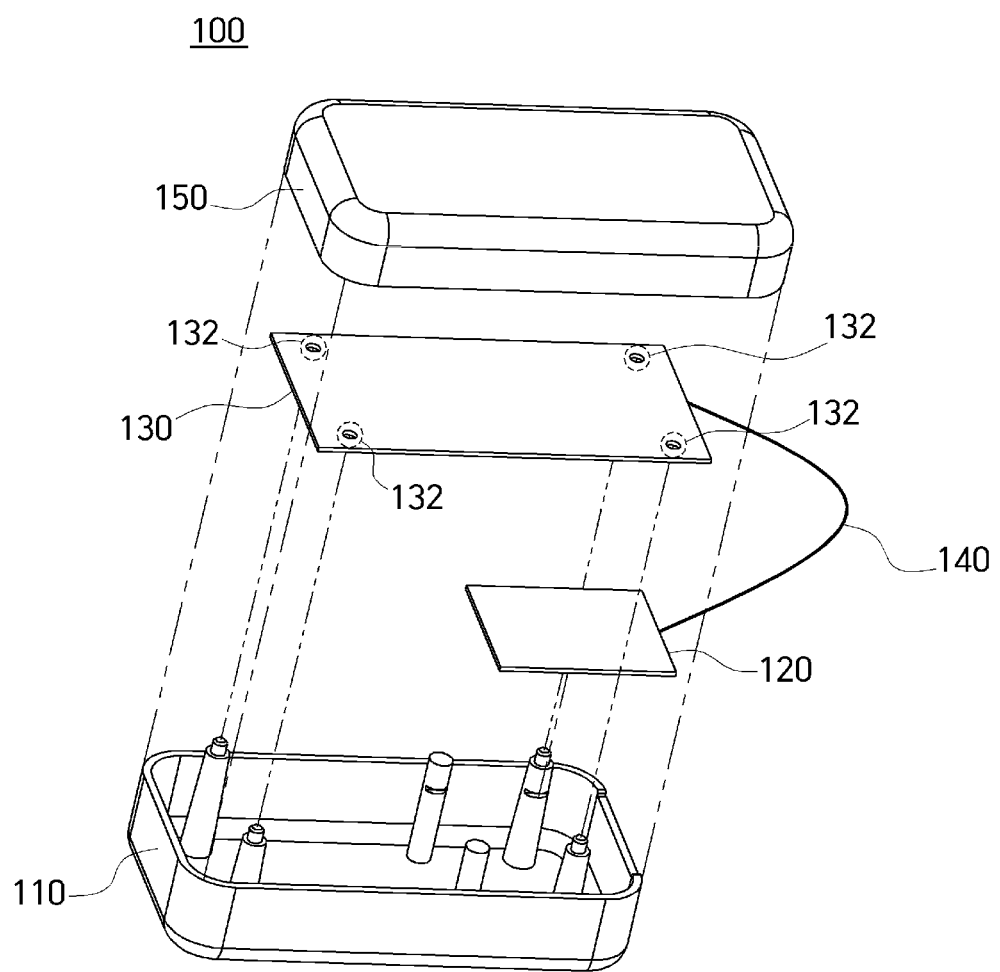
FIG. 4 is an exploded perspective view of the module assembly illustrated in FIG. 3.

FIG. 4 is an exploded perspective view of the module assembly 100 illustrated in FIG. 3.

Referring to FIG. 4, the module assembly 100 may include the base 110, a first printed circuit board (PCB) 120, a second PCB 130, a flexible cable 140, and a cover 150.

The cover 150 may be assembled with the base 110 to cover an upper portion of the base 110. An internal space may be formed based on an assembly of the base 110 and the cover 150.

The first PCB 120, the second PCB 130, and the flexible cable 140 may be accommodated into the internal space.

The first PCB 120 may be a digital key 2.0 module (hereinafter referred to as a digital key module) or a rear occupant alert (ROA) module.

The second PCB 130 may be stacked on an upper portion of the first PCB 120, and when the first PCB 120 is a digital key module, the second PCB 130 may be an ROA module. On the other hand, when the first PCB 120 is an ROA module, the second PCB 130 may be a digital key module.

In an embodiment of the present invention, it may be assumed that the first PCB 120 is a digital key 2.0 module and the second PCB 130 is an ROA module.

In order to implement a digital key 2.0 module, a Bluetooth low energy (BLE) antenna element and a BLE circuit element(s) for processing a signal transmitted or received through the BLE antenna element may be mounted on the first PCB 120. In this case, the first PCB 120 may be referred to as a BLE PCB.

In order to implement an ROA module, an ROA antenna element and an ROA circuit element(s) for processing a signal transmitted or received through the ROA antenna element may be mounted on the second PCB 130. In this case, the second PCB 130 may be referred to as an ROA PCB. The ROA antenna element may be, for example, an antenna element which receives an ultrasonic signal for sensing whether a rear occupant is on board.

For conciseness of the drawing, a BLE antenna element, a BLE circuit element, an ROA antenna element, and an ROA circuit element are not illustrated in FIG. 4.

The flexible cable 140 may electrically connect the first PCB 120, on which a BLE antenna element and a BLE circuit element are mounted for a digital key module, to the second PCB 130 on which an ROA antenna element and an ROA circuit element are mounted for implementing an ROA module.

In this manner, the first PCB 120 may be electrically connected to the second PCB 130 by using the flexible cable 140, and thus, a digital key module and an ROA module may be integrated into one module assembly 100.

A size of the first PCB 120 may be designed to be less than that of the second PCB 130, and thus, a BLE circuit element other than a BLE antenna element among elements mounted on the first PCB 120 configuring a digital key module may be mounted on the second PCB 130. In this case, an ROA antenna element, an ROA circuit element, and a BLE circuit element may be mounted on the second PCB 130.

For example, in a case where the first PCB 120 is implemented as a board for implementing an ROA module and the second PCB 130 is implemented as a board for implementing a digital key module, only an ROA antenna element may be mounted on the first PCB 120, and the other ROA circuit element may be mounted on the second PCB 130 which is greater in size than the first PCB 120. In this case, a BLE antenna element, a BLE circuit element, and an ROA circuit element may be mounted on the second PCB 130.

As described above, because a size of the first PCB 120 is designed to be less than that of the second PCB 130, a circuit element (a BLE circuit element or an ROA circuit element) to be mounted on the first PCB 120 may move to the second PCB 130, thereby decreasing the manufacturing cost of the first PCB 120.

Moreover, because only an antenna element (a BLE antenna element or an ROA antenna element) is mounted on the first PCB 120, when the module assembly 100 performs an abnormal operation (an abnormal operation of a digital key module or an abnormal operation of an ROA module), a defect of the antenna element (the BLE antenna element or the ROA antenna element) mounted on the first PCB 120 may be easily and quickly detected by replacing the first PCB 120.

A BLE antenna element and an ROA antenna element mounted on the first and second PCBs 120 and 130 should be toward an indoor portion of a vehicle. However, the first and second PCBs 120 and 130 may be accommodated into the module assembly 100 in a vertically stacked structure as illustrated in FIG. 4, and thus, a position at which an antenna element is mounted on each PCB may be appropriately determined to minimize interference between a signal transmitted or received through a BLE antenna element and a signal transmitted or received through an ROA antenna element.

Figure 5:
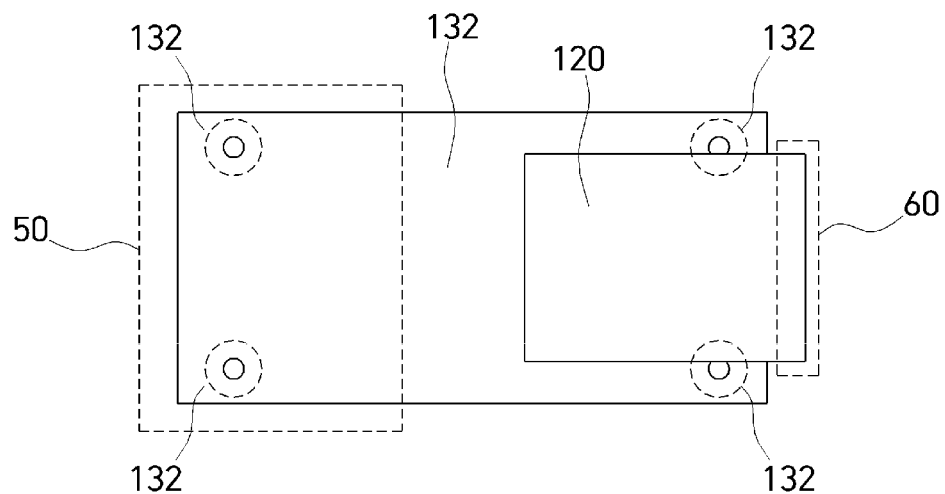
FIG. 5 is a diagram for describing a mount position of an antenna element mounted on a second printed circuit board (PCB) illustrated in FIG. 4.

For example, as illustrated in FIG. 5, an ROA antenna element may be mounted in a region 50, which does not overlap the first PCB 120, of a whole region of the second PCB 130.

As described above, when the ROA antenna element is mounted in the region 50, which does not overlap the first PCB 120, of the whole region of the second PCB 130, signal interference occurring between an ROA antennal element and a BLE antenna element may be minimized.

Figure 6:
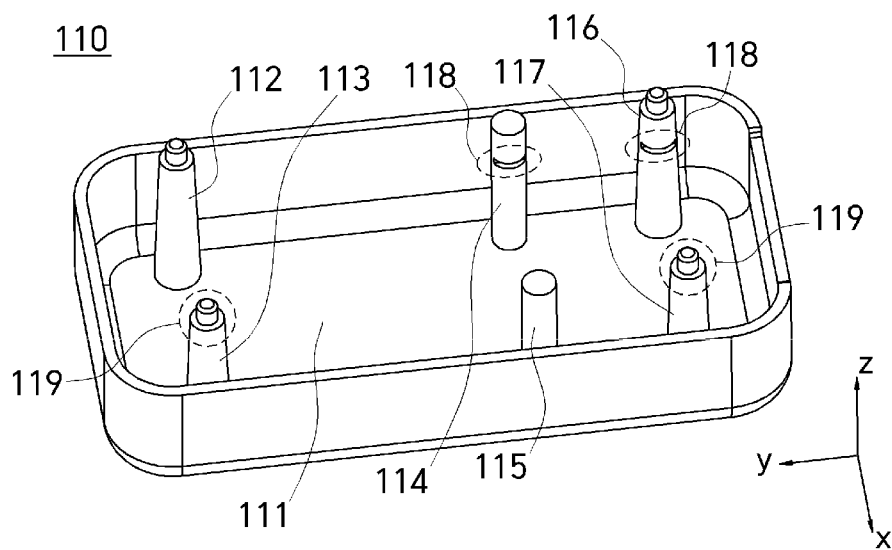
FIG. 6 is an enlarged view of a base illustrated in FIG. 4.
Figure 7:
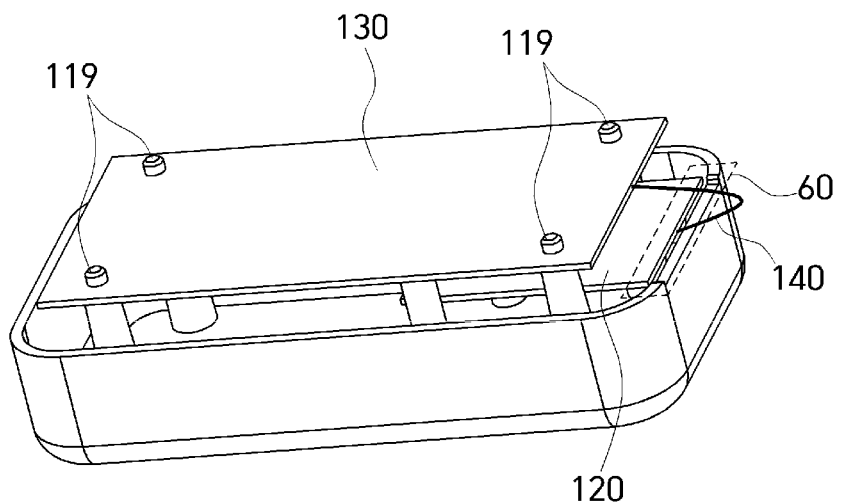
FIG. 7 is a perspective view illustrating an example where first and second PCBs illustrated in FIG. 4 are stacked on the base.

FIG. 6 is an enlarged view of the base 110 illustrated in FIG. 4, and FIG. 7 is a perspective view illustrating an example where the first and second PCBs 120 and 130 illustrated in FIG. 4 are stacked on the base 110.

Referring to FIG. 6, the base 110 may include a plurality of supporting parts 112 to 117 which each have a hexahedral shape, where an upper portion thereof is open, and extend in a vertical direction from an inner bottom surface 111 of the base 110.

The plurality of supporting parts 112 to 117 may fix and support the first and second PCBs 120 and 130 on the base 110.

Each of the supporting parts 112 to 117 may have a pillar shape and may be referred to as a supporting pillar.

A protrusion portion 119 may be formed on an end surface of each of the supporting parts 112, 113, 118, and 119 extending in a vertical direction from a corner of the inner bottom surface 111 of the base 110 among the plurality of supporting parts 112 to 117 and may be inserted into a corresponding groove of grooves (132 of FIGS. 4 and 5) molded at a corner of the second PCB 130.

The protrusion portion 119 molded on an end surface of each of the supporting parts 112, 113, 118, and 119 may be inserted into and coupled to the groove (132 of FIGS. 4 and 5) molded at the corner of the second PCB 130, and thus, in the second PCB 130, a degree of freedom 5 may be restrained in directions other than a Z-axis direction.

An end surface of each of the supporting parts 114 and 115 disposed between the supporting parts 112 and 113 and the supporting parts 118 and 119 molded near both corners of the inner bottom surface 111 of the base 110 among the plurality of supporting parts 112 to 117 may support a bottom surface of the second PCB 130.

Simultaneously, as illustrated in FIG. 7, the supporting parts 114 and 115 may support the first PCB 120 stacked on a lower portion of the second PCB 130 along with the supporting parts 116 and 117.

To this end, a sliding groove, molded in order for the first PCB 120 to be inserted thereinto in a side direction of the base 110, may be included in a body having a cylindrical shape of each of the supporting parts 114 and 115 and the supporting parts 116 and 117.

Figure 10:
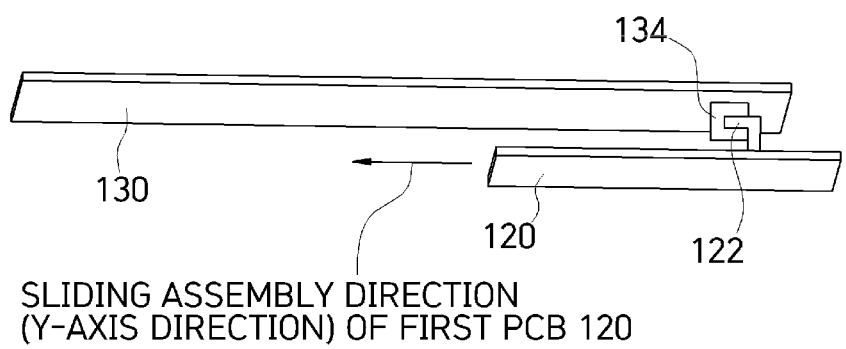
FIG. 10 is a diagram for describing a connection structure between first and second PCBs, according to another embodiment of the present invention.

The first PCB 120 may be inserted into the sliding groove molded in the body of each of the supporting parts 114 to 117 by using a sliding method, and thus, the degree of freedom 5 may be restrained in directions other than an insertion direction (a Y-axis direction) of the first PCB 120. Here, as illustrated in FIG. 10, the insertion direction (the Y-axis direction) of the first PCB 120 may be referred to as a sliding assembly direction.

Figure 8:
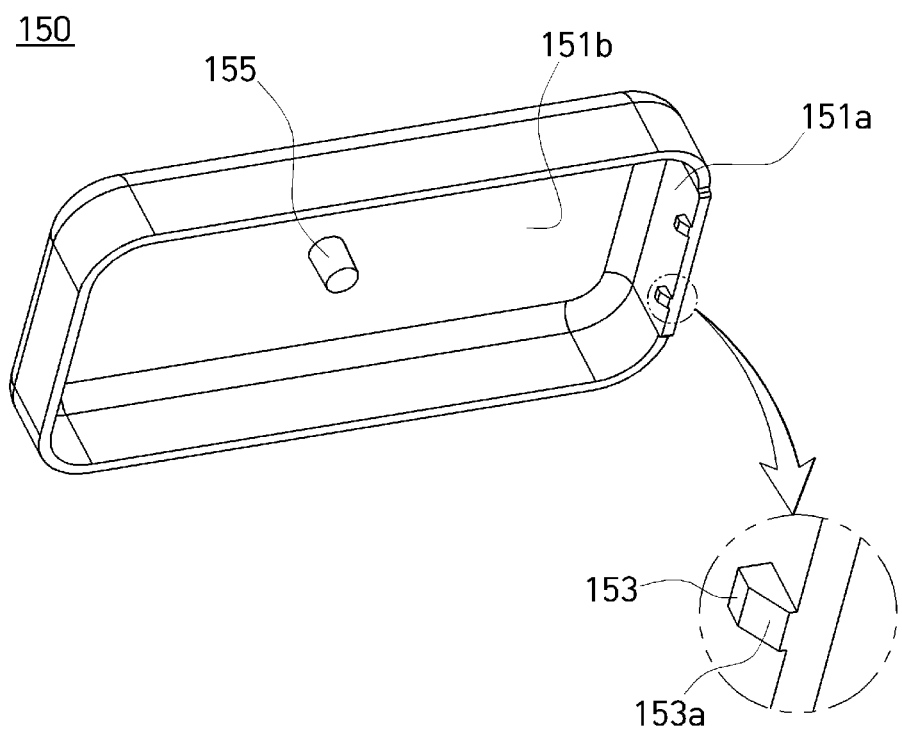
FIG. 8 is an enlarged view as a cover illustrated in FIG. 4 is seen in a different direction.
Figure 9:
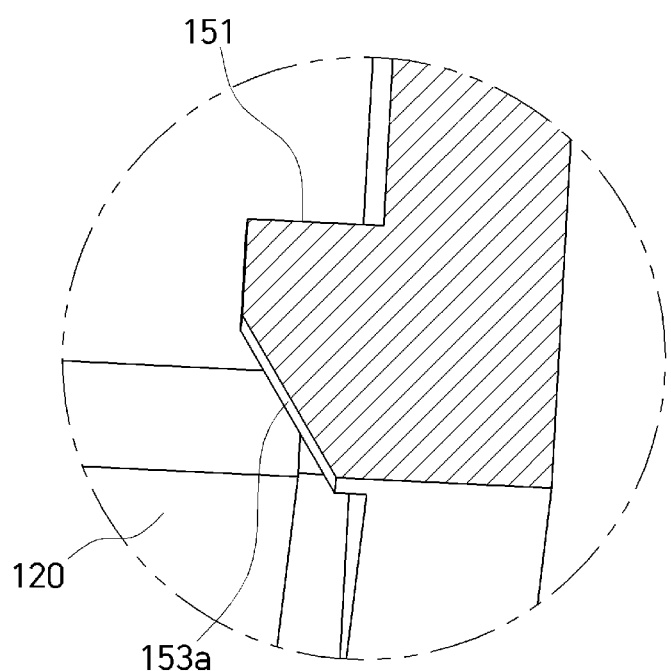
FIG. 9 is a partial cross-sectional view illustrating an example where a first fixing boss illustrated in FIG. 8 restrains a first PCB.

FIG. 8 is an enlarged view as the cover 150 illustrated in FIG. 4 is seen in a different direction, and FIG. 9 is a partial cross-sectional view illustrating an example where a first fixing boss illustrated in FIG. 8 restrains a first PCB.

First, referring to FIG. 8, the cover 150 may be assembled with the base 110 to cover an upper portion of the base 110 and may cover the first and second PCBs 120 and 130 stacked (mounted) on the base 110.

The cover 150 may have a hexahedral shape where a lower portion thereof is open and may include at least two first fixing bosses 153 molded on an inner surface 151a thereof and a second fixing boss 155 which is molded to extend in a vertical direction from an inner bottom surface 151b thereof.

The first fixing boss 153 may restrain a degree of freedom in the insertion direction (the Y-axis direction) of the first PCB 120 which is not restrained on the base 110.

To this end, a corner portion of the first fixing boss 153 may be molded to include an inclined surface 153a. In a process of performing assembly in order for the cover 150 to cover an upper portion of the base 110, as illustrated in FIG. 9, the inclined surface 153a may press one end portion (60 of FIGS. 5 and 7) of the first PCB 120 which does not overlap the second PCB 130, and thus, a degree of freedom in the insertion direction (the Y-axis direction) of the first PCB 120 may be restrained.

As described above, the inclined surface 153a of the first fixing boss 153 may press the one end portion (60 of FIGS.

5 and 7) of the first PCB 120, and thus, may restrain a degree of freedom 6 of the first PCB 120.

The second fixing boss 166 extending in a vertical direction from the inner bottom surface 151b of the cover 150 may press a top surface of the second PCB 130 stacked on the first PCB 120, and thus, may restrain a degree of freedom in a vertical direction (a Z-direction) of the second PCB 130.

As described above, the second fixing boss 155 may press the top surface of the second PCB 130, and thus, may restrain the degree of freedom 6 of the second PCB 130.

FIG. 10 is a diagram for describing a connection structure between first and second PCBs, according to another embodiment of the present invention.

Referring to FIG. 10, the connection structure between the first and second PCBs according to another embodiment of the present invention may be a docking structure between a male connector 122 mounted on the first PCB 120 and a female connector 134 mounted on the second PCB 130, and thus, may have a difference with a structure where the first PCB 120 is connected to the second PCB 130 by the flexible cable 140 in the embodiment of FIG. 4.

Figure 11:
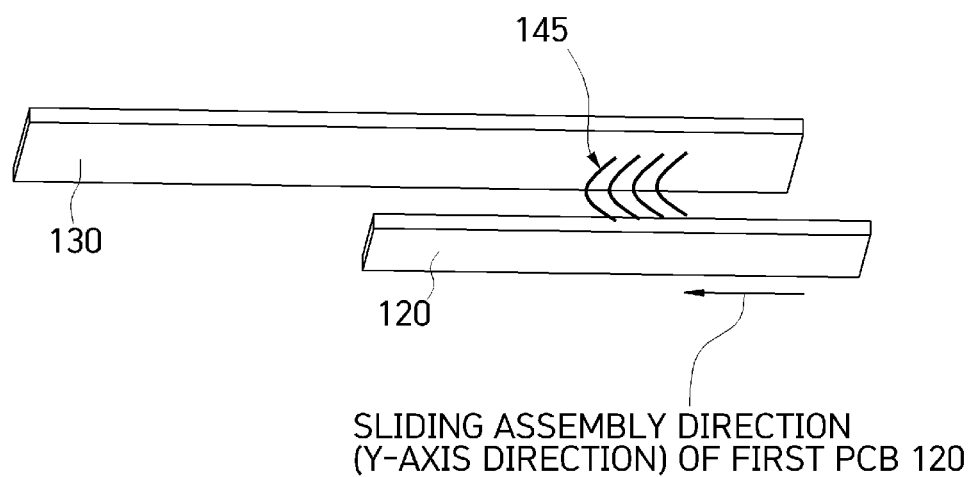
FIG. 11 is a diagram for describing a connection structure between first and second PCBs, according to another embodiment of the present invention.

FIG. 11 is a diagram for describing a connection structure between first and second PCBs 120 and 130, according to another embodiment of the present invention.

Referring to FIG. 11, the connection structure between the first and second PCBs 120 and 130 according to another embodiment of the present invention may be a structure where the first PCB 120 is connected to the second PCB 130 by a spring terminal 145, and thus, may have a difference with a connection structure according to the embodiments of FIGS. 4 and 10.

For example, the spring terminal 145 may be mounted on the first PCB 120 and a copper film pattern electrically contacting the spring terminal 145 may be patterned on the second PCB 130, and thus, the first PCB 120 may be inserted into a sliding groove 118 molded in a body having a pillar shape of each of supporting parts 114 to 117 of a base 110. In a process of performing such a process, the spring terminal 145 of the first PCB 120 may naturally contact the copper film pattern patterned on the second PCB 130.

The spring terminal 145 may be mounted on the second PCB 130, and in this case, the copper film pattern may be patterned on the first PCB 120.

As described above, the present invention may propose a module assembly having a structure where a digital key module and an ROA module are integrated as one body without a fastening means such as a bracket, a bolt, and a nut, and thus, without a limitation of a space caused by a conventional ROA module installed in a headlining, the digital key module and the ROA module may be integrated as one module assembly and may be installed in the headlining.

Moreover, the connection structure according to the embodiments of FIGS. 10 and 11 may be proposed so that a PCB with an antenna of a digital key module mounted thereon is easily detached from and inserted into the module assembly according to the present invention on the basis of an option, thereby ① enhancing workability, ② overcoming a limited package, and ③ securing competitiveness through integration contract.

In the module assembly according to the present invention, a digital key 2.0 module and an ROA system (or an ROA module) may be integrated as one body without a fastening means such as a bracket, a bolt, and a nut, and thus, the digital key 2.0 module may be installed in a headlining without a limitation of a space caused by a conventional ROA module installed in the headlining.

Moreover, the module assembly according to the present invention may be designed so that a PCB with an antenna of the digital key 2.0 module mounted thereon is easily detached from and inserted into the module assembly on the basis of an option, thereby ① enhancing workability, ② overcoming a limited package, and ③ securing competitiveness through integration contract.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A module assembly for a vehicle, the module assembly comprising:
   a base where an upper portion thereof is open;
   a first printed circuit board (PCB) and a second PCB sequentially stacked on a plurality of supporting pillars extending in a vertical direction to an inner bottom surface of the base and electrically connected to each other by a flexible cable, wherein the first PCB is less in size than the second PCB stacked thereon,
   a rear occupant alert (ROA) antenna element is mounted in a region, which does not overlap the first PCB, of a whole region of the second PCB; and
   a cover assembled with the base to cover the first and second PCBs stacked on the base.

2. The module assembly of claim 1, wherein
   a Bluetooth low energy (BLE) antenna element and a BLE circuit element for processing a signal transmitted or received though the BLE antenna element are mounted on the first PCB to have a function of a digital key module, and
   an ROA circuit element for processing a signal transmitted or received though the ROA antenna element are mounted on the second PCB stacked on the first PCB to have a function of an ROA module.

3. The module assembly of claim 1, wherein
   a Bluetooth low energy (BLE) antenna element of a digital key module is mounted on the first PCB, and
   an ROA circuit element for processing a signal transmitted or received though the ROA antenna element, and a BLE circuit element for processing a signal transmitted or received though the BLE antenna element are mounted on the second PCB.

4. The module assembly of claim 1, wherein a protrusion portion inserted into each of a plurality of grooves molded in a corner of the second PCB is formed on an end surface of each of some supporting pillars among the plurality of supporting pillars.

5. The module assembly of claim 1, wherein a sliding groove, molded to enable the first PCB to be inserted thereinto in a side direction of the base, is provided in a body of each of some supporting pillars among the plurality of supporting pillars.

6. The module assembly of claim 1, wherein the cover comprises:
   at least two first fixing bosses molded on one inner surface thereof to restrain a degree of freedom in a direction in which the first PCB is inserted into a sliding groove molded in each of some supporting pillars among the plurality of supporting pillars; and a second fixing boss extending in a vertical direction from an inner bottom surface thereof and pressing a top surface of the second PCB to restrain a degree of freedom in the vertical direction of the second PCB.

7. The module assembly of claim 6, wherein
the first fixing boss comprises an inclined surface where a corner portion thereof is trimmed, and
the inclined surface presses one end portion of the first PCB, which does not overlap the second PCB, to restrain a degree of freedom in a direction in which the first PCB is inserted into the sliding groove.

8. A module assembly for a vehicle, the module assembly comprising:
a base where an upper portion thereof is open;
a first printed circuit board (PCB) and a second PCB sequentially stacked on a plurality of supporting pillars extending in a vertical direction to an inner bottom surface of the base and connected to each other in a docking structure between a male connector and a female connector; and
a cover assembled with the base to cover the first and second PCBs stacked on the base,
wherein the male connector and a rear occupant alert (ROA) antenna element are mounted on the first PCB, and
the female connector docked with the male connector, an ROA circuit element for processing a signal transmitted or received though the ROA antenna element, a Bluetooth low energy (BLE) antenna element, and a BLE circuit element for processing a signal transmitted or received though the BLE antenna element are mounted on the second PCB stacked on the first PCB.

9. The module assembly of claim 8, wherein a protrusion portion inserted into each of a plurality of grooves molded in a corner of the second PCB is formed on an end surface of each of some supporting pillars among the plurality of supporting pillars.

10. The module assembly of claim 8, wherein a sliding groove, molded to enable the first PCB to be inserted thereinto in a side direction of the base, is provided in a body of each of some supporting pillars among the plurality of supporting pillars.

11. The module assembly of claim 8, wherein the cover comprises:
at least two first fixing bosses molded on one inner surface thereof to restrain a degree of freedom in a direction in which the first PCB is inserted into a sliding groove molded in each of some supporting pillars among the plurality of supporting pillars; and
a second fixing boss extending in a vertical direction from an inner bottom surface thereof and pressing a top surface of the second PCB to restrain a degree of freedom in the vertical direction of the second PCB.

12. A module assembly for a vehicle, the module assembly comprising:
a base where an upper portion thereof is open;
a first printed circuit board (PCB) and a second PCB sequentially stacked on a plurality of supporting pillars extending in a vertical direction to an inner bottom surface of the base and electrically connected to each other by a spring terminal; and
a cover assembled with the base to cover the first and second PCBs stacked on the base,
wherein the spring terminal and a Bluetooth low energy (BLE) antenna element are mounted on the first PCB,
a rear occupant alert (ROA) antenna element, an ROA circuit element for processing a signal transmitted or received though the ROA antenna element, and a BLE circuit element for processing a signal transmitted or received though the BLE antenna element are mounted on the second PCB stacked on the first PCB.

13. The module assembly of claim 12, wherein
a copper film pattern electrically contacting the spring terminal are patterned on the second PCB.

14. The module assembly of claim 12, wherein
a protrusion portion inserted into each of a plurality of grooves molded in a corner of the second PCB is formed on an end surface of each of some supporting pillars among the plurality of supporting pillars, and
a sliding groove, molded to enable the first PCB to be inserted thereinto in a side direction of the base, is provided in a body of each of some supporting pillars among the plurality of supporting pillars.

15. The module assembly of claim 12, wherein
the first PCB is less in size than the second PCB stacked thereon, and
the ROA antenna element is mounted in a region, which does not overlap the first PCB, of a whole region of the second PCB.

* * * * *